US008975924B2

(12) United States Patent
Praamsma et al.

(10) Patent No.: US 8,975,924 B2
(45) Date of Patent: Mar. 10, 2015

(54) PHASE FREQUENCY DETECTOR CIRCUIT

(71) Applicant: NXP B.V., Eindhoven (NL)

(72) Inventors: Louis Praamsma, Arnhem (NL); Nikola Ivanisevic, Novi Sad (RS)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/142,552

(22) Filed: Dec. 27, 2013

(65) Prior Publication Data

US 2014/0191786 A1    Jul. 10, 2014

(30) Foreign Application Priority Data

Jan. 4, 2013   (EP) .................................... 13150315

(51) Int. Cl.
*H03D 13/00* (2006.01)
*H03L 7/089* (2006.01)

(52) U.S. Cl.
CPC ............ *H03L 7/0891* (2013.01); *H03D 13/004* (2013.01)
USPC .................... 327/12; 327/3; 327/156; 331/25; 375/374

(58) Field of Classification Search
CPC ............... H03D 13/003; H03D 13/004; H03L 7/085–7/0891; H03L 7/091; H03K 5/26; G01R 25/00; G01R 25/005
USPC ...................... 327/2, 3, 5, 7–10, 12, 147–149, 327/156–158; 331/25; 375/373–376
See application file for complete search history.

(56) References Cited

U.S. PATENT DOCUMENTS

| 5,892,380 | A  | * | 4/1999 | Quist ............................ 327/172 |
| 6,049,233 | A  | * | 4/2000 | Shurboff ........................... 327/2 |
| 7,042,970 | B1 |   | 5/2006 | Keaveney et al. |
| 7,176,763 | B2 | * | 2/2007 | Park ................................ 331/17 |
| 7,400,204 | B2 | * | 7/2008 | Thomsen et al. ............... 331/25 |
| 7,412,617 | B2 | * | 8/2008 | Chang ........................... 713/503 |
| 2007/0240010 | A1 |   | 10/2007 | Chang |

FOREIGN PATENT DOCUMENTS

GB        2335557 A       9/1999

OTHER PUBLICATIONS

Arshak, K. "Design and Simulation Difference Types CMOS Phase Frequency Detector for High Speed and Low Jitter PLL", Proceedings of the Fifth IEEE Intl. Caracas Conf., pp. 188-191 (Nov. 2004).
Lan, J. et al. "A Nonlinear Phase Frequency Detector for Fast-Lock Phase-Locked Loops", IEEE 8th Intl. Conf. on ASIC, pp. 1117-1120 (Oct. 2009).
Yan, J. "A High-Speed Frequency Acquisition PLL Using Phase Frequency Detector with Variable Gain", 53rd IEEE Intl. Midwest Symp.on Circuits and Systems (MWSCAS), pp. 101-104 (Aug. 2010).

(Continued)

*Primary Examiner* — Patrick O'Neill

(57) ABSTRACT

A phase-frequency detector (PFD) circuit is disclosed. The PFD circuit includes a PFD portion adapted to detect frequency and phase difference of two input signals and to generate control signals according to the detected frequency and phase difference and a delay and reset portion adapted to delay the generated control signals, to generate reset signals for resetting the PFD portion based on a combination of the control signals and the delayed control signals, and to provide the generated reset signals to the PFD portion.

12 Claims, 7 Drawing Sheets

(56) References Cited

OTHER PUBLICATIONS

R&S, "SMA100 Signal Generator", 20 pgs., retrieved from the Internet at: http://www.microlease.com/Static/Catalogue/Datasheets/Rohde&Schwarz_SMA100A.

Semiconductor Components Industries, LLC, "MC12080 , 1.1 GHz Prescaler", 4 pgs., retrieved from the Internet at http://www.onsemi.com/pub_link/Collateral/MC12080-D.

NXP B.V., "AN11225, Demonstration of a 1GHz Discrete VCO Based on the BFR92A", 6 pgs., retrieved from the Internet Jun. 26, 2012 at :http://www.nxp.com/documents/application_note/AN11225.

Bowman, R. et al., "Basic Integrated Circuit Technology Reference Manual", 110 pgs. retrieved from the Internet at: http://smithsonianchips.si.edu/ice/cd/BT/SECTION2.

Extended European Search Report for EP Patent Appln. No. 13150315.3 (Jun. 25, 2013).

* cited by examiner

PHASE FREQUENCY DETECTOR CIRCUIT

CROSS-REFERENCE TO RELATED APPLICATIONS

This application claims the priority under 35 U.S.C. §119 of European patent application no. 13,150,315.3, filed on Jan. 4, 2013, the contents of which are incorporated by reference herein.

FIELD OF THE INVENTION

This invention relates to phase-locked loop (PLL) circuits, and more particular to a phase frequency detector (PFD) circuit for a PLL circuit.

BACKGROUND

Phase-locked loop (PLL) circuits are well-known in the field of communication systems. They are also they are also commonly used in frequency generating circuits (synthesizers) where quality (accuracy, temperature stability, jitter) of one oscillator is improved by locking to a second higher quality oscillator. The typical task of a PLL is to reproduce and track an original signal while removing as much of the noise as possible. Because of this, they are often used as narrow band filters in low noise satellites communications.

A Phase-Frequency Detector (PFD) is a basic building block of a conventional PLL. Such a conventional PLL is shown in FIG. 1 and, in addition to a PFD, comprises a voltage-controlled oscillator (VCO), a frequency divider, a charge pump (CP) and a loop filter. Here, the CP is an extension of the PFD and is thus analysed (and labelled) in combination with the PFD.

FIG. 1 also shows the various accompanying noise sources in the conventional PLL circuit.

The transfer function of the PLL relates the output phase of the reference signal to the output phase of the VCO. The transfer function of the noise sources present in the different blocks can have a high pass and a low pass characteristic depending on the block being analysed. From the VCOs point, its phase noise has a high pass characteristic to the output of the PLL. From the rest of the blocks it has a low pass characteristic. Therefore, the in-band phase noise floor of the PLL is determined by the noises of the: crystal oscillator's phase noise $\phi_X$, reference divider's phase noise $\phi_{ref}$, main divider's phase noise $\phi_d$, phase-frequency detector's phase noise $\phi_{pd}$, charge pump current noise $i_{np}$ and loop filter voltage noise $V_{nf}$, and can be expressed as the following equation (Equation 1):

$$\phi_{in-band}^2 = \phi_X^2 + \phi_{ref}^2 + \phi_d^2 + \phi_{pd}^2 + \phi_{LPg}^2 + \phi_{CP}^2 \text{ [dBc/Hz]}. \quad (1)$$

The in-band noise floor is important because it sets the noise floor for the receiving signal. Assuming a good low phase noise crystal oscillator and a low noise frequency divider, the predominant in-band noise contributor is the PFD/CP block.

The CP current noise can be decreased on a circuit level. For example, using bipolar instead of MOSFET current mirrors can help lower the 1/f noise. Resistive emitter degeneration in a current mirror can also help reduce the transistors current noise. Another approach to reducing the CP current noise can be taken on a system level. Here, to analyse this, the output noise of the charge pump $i_{np}(f)$ is referred back to the input of the PFD/CP (because it has a low pass transfer function) as phase noise as written in equation 2 below:

$$PN_{CP} = 10\log(\varphi_{CP}^2) = 10\log\left(\frac{i_{np}(f)}{K_{pd}}\right)^2 = 20\log\left(2\pi\frac{i_{np}(f)}{I_{CP}}\right) \text{[dBc/Hz]}, \quad (2)$$

where $K_{pd} = I_{CP}/2\pi$ is the gain of the PFD/CP block and $I_{CP}$ is the dc value of the CP current. From this, it can be seen that a higher value of $K_{pd}$ will result in lower system noise. Accordingly, the typical approach to increase $K_{pd}$ is to increase $I_{CP}$, nut this has the drawback of increasing power consumption and decreasing the voltage headroom of the CP output, as well as increasing the noise of the charge pump $i_{np}(f)$.

BRIEF SUMMARY OF THE INVENTION

There is proposed an improvement to a phase-frequency detector circuit which may increase its gain by a factor of two without increasing charge pump (CP) current. As a result, embodiments may be employed to improve the contribution of charge pump noise in a PLL's in-band phase noise floor by up to 6 dB.

According to an aspect of the invention there is provided a PFD circuit according to claim 1.

A PLL circuit may employ an embodiment of the invention. Additional gain provided by an embodiment may enable a higher noise of the charge pump to be tolerated, thereby allowing a wider tuning range of the VCO in the PLL to be accepted.

Embodiments may be employed in an optical communication device that uses NRZ signals.

According to another aspect of the invention, there is provided a method of phase-frequency detection for a PLL according to claim 9.

According to another aspect of the invention, there is provided a computer program product for phase-frequency detection according to claim 10.

According to yet another aspect of the invention, there is provided a computer system phase-frequency detection according to claim 11.

Embodiments may find application in TFF1xxxx series devices which are optimized for use in microwave applications between 7 and 15 GHz. Applications of such devices include VSAT systems, microwave radio and down conversion in LNBs.

BRIEF DESCRIPTION OF THE DRAWINGS

Preferred embodiments of the present invention will now be described, by way of example only, with reference to the following drawings in which.

DETAILED DESCRIPTION OF THE EMBODIMENTS

Various techniques for improving the noise performance of a PLL are known, including: increasing the reference frequency, increasing the charge pump current and improving the noise performance of the charge pump. However, these known techniques exhibit various drawbacks. For example, a higher reference frequency may result in a more expensive overtone crystal, or may be incompatible with a given system reference frequency. Increasing the charge pump current may lead to higher spurious components, while decreasing it can facilitate smaller loop filter components and an eventual integration of the loop filter on chip. Improving the noise performance of the CP by using resistive (emitter/source) degeneration comes at the cost of available tuning range.

In an attempt to avoid the abovementioned drawbacks, the inventors have devised a concept for increasing the gain of the PFD/CP of a PLL without increasing the CP current.

The transfer function of the PFD/CP is the relationship between the phase difference at the input and the average output current. There is proposed a way to modify it to accommodate for larger gain.

Figure 2:
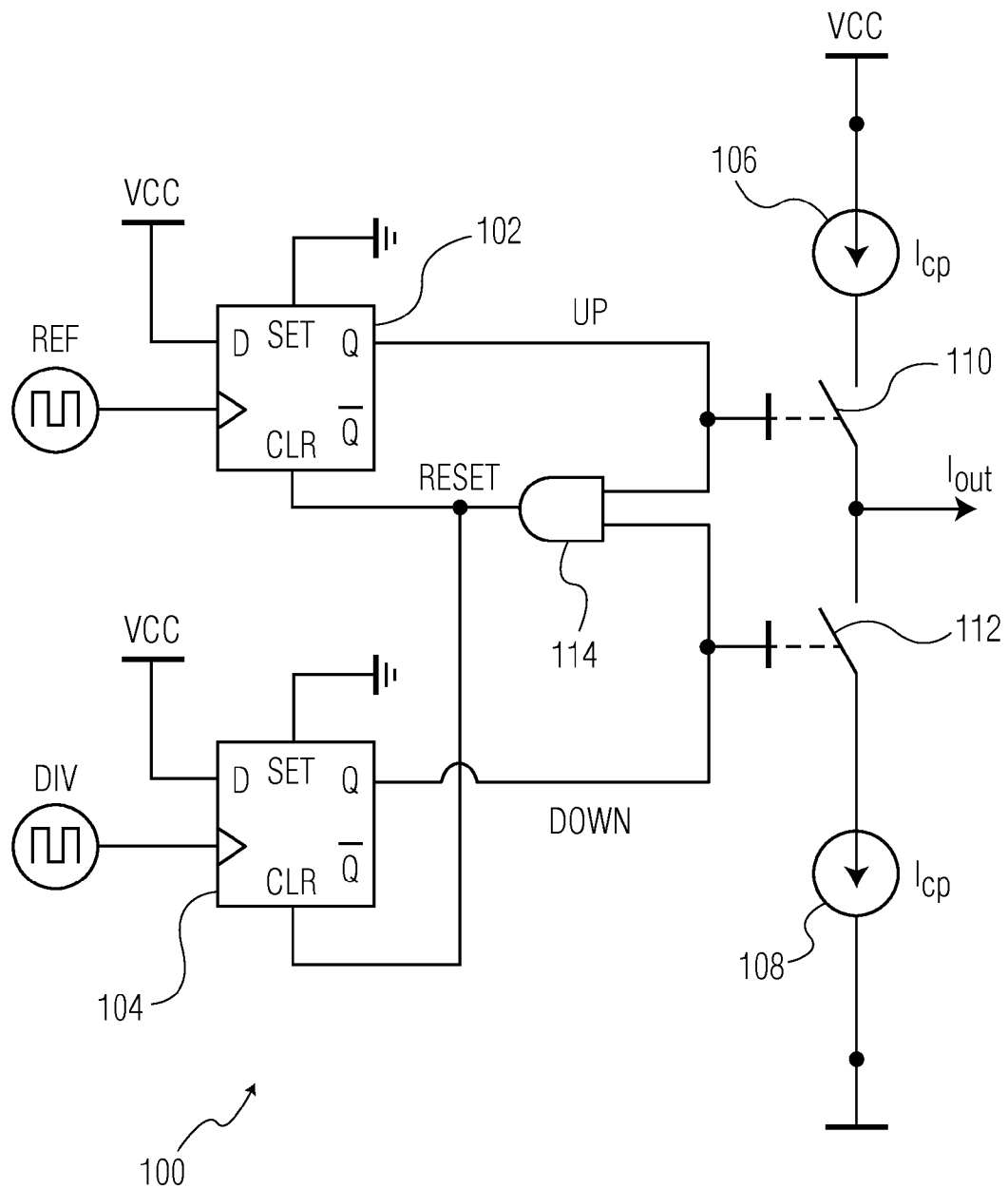
FIG. 2 is a schematic block diagram of a conventional PFD circuit.

FIG. 2 illustrates a conventional PFD circuit 100 having first 102 and second 104 data flip-flops connected to first 106 and second 108 current sources via first 110 and second 112 switches, respectively.

A reference frequency signal REF is provided to the clock input terminal of the first data flip-flop 102, and divider frequency signal DIV is provided to the clock input terminal of the second data flip-flop 104. The data D input terminal of each data flip-flop is connected to a positive voltage supply rail VCC The first 106 and second 108 current sources are connected in series between the positive voltage supply rail VCC and ground GND. The first 110 and second 112 switches are connected in series between the first and second current sources. An output terminal for supplying an output current $I_{OUT}$ of the PFD circuit 100 is connected to point between the first 110 and second 112 switches.

The data Q output of the first data flip flop 102 is connected to the control terminal of the first switch 110, and also connected to the first input of an AND logic gate 114. The data Q output of the first data flip flop 102 thus provides an "UP" signal for controlling the operation of the first switch 110 and thus provision of current from the first current source 106 to the output terminal.

The data Q output of the second data flip flop 104 is connected to the control terminal of the second switch 112, and also connected to the second input of the AND logic gate 114. The data Q output of the second data flip flop 104 thus provides a "DOWN" signal for controlling the operation of the second switch 112 and thus discharging of current via the second current source 108.

The output of the AND logic gate 114 is provided to the reset CLR terminal of each of the first 102 and second 104 data flip flops. In other words, the output of the AND logic gate is adapted to be the reset signal for each of the data flip-flops 102, 104, wherein the reset signal is based on the value of both the UP and DOWN signals.

Figure 3A:
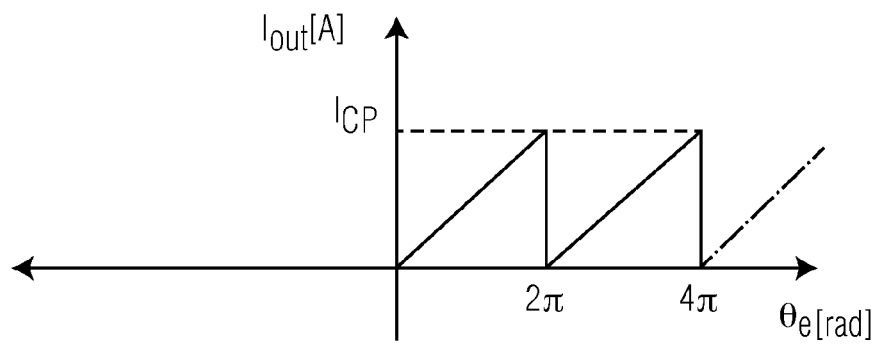
FIGS. 3A and 3B illustrate the relationship between the average output current for positive and negative variations of phase difference at the input of the conventional PFD circuit of FIG. 2, respectively.
Figure 3B:
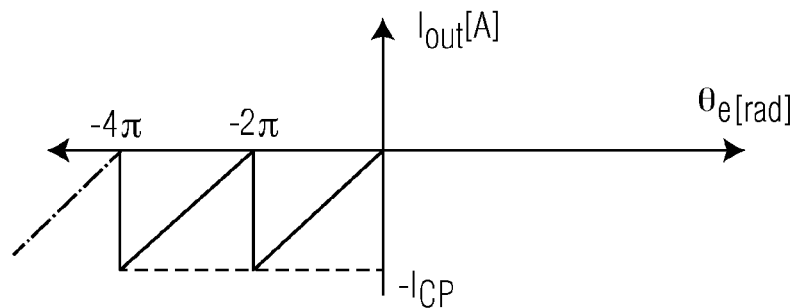

FIGS. 3A and 3B illustrate the relationship between the average output current $\overline{I_{OUT}}$ for positive and negative variations of phase difference at the input of the conventional PFD circuit of FIG. 2, respectively. It will be understood that one current source is "on" only for positive phase errors, while the other current source is "on" only for negative.

Figure 1:
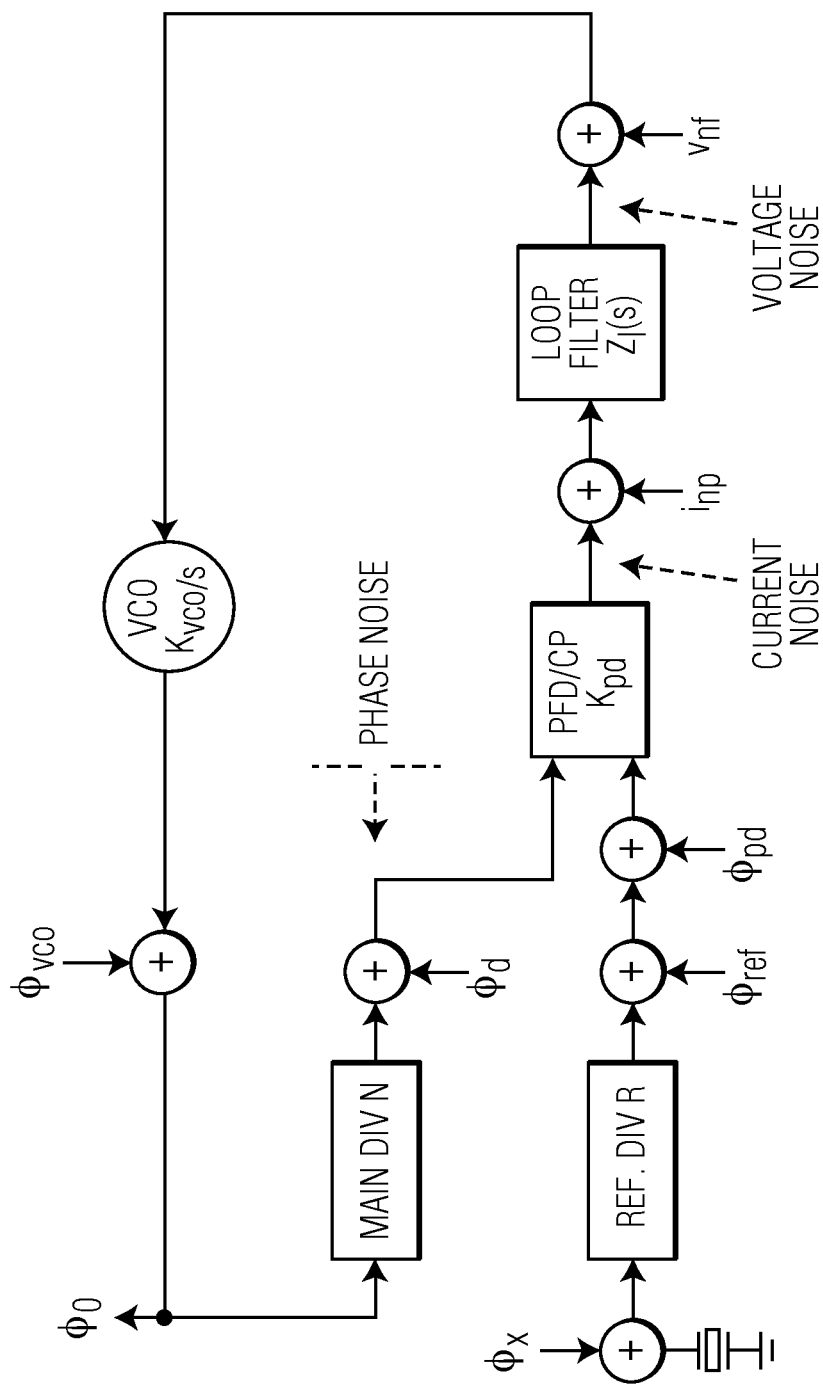
FIG. 1 is a schematic block diagram of a conventional PLL circuit.
Figure 3C:
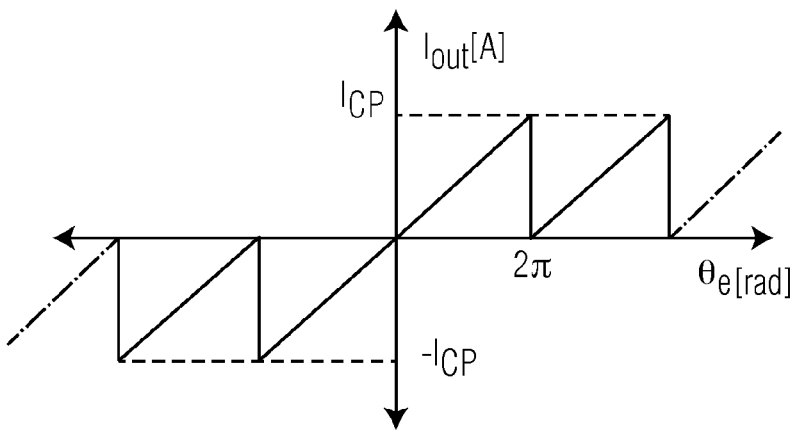
FIG. 3C illustrates the combined relationship between the average output current for variations of phase difference at the input of the conventional PFD circuit of FIG. 2.

FIG. 3C illustrates the combined relationship between the average output current $\overline{I_{OUT}}$ for variations of phase difference at the input of the conventional PFD circuit of FIG. 2. In other words, FIG. 3 illustrates the transfer function of the conventional PFD circuit of FIG. 1.

Figure 4:
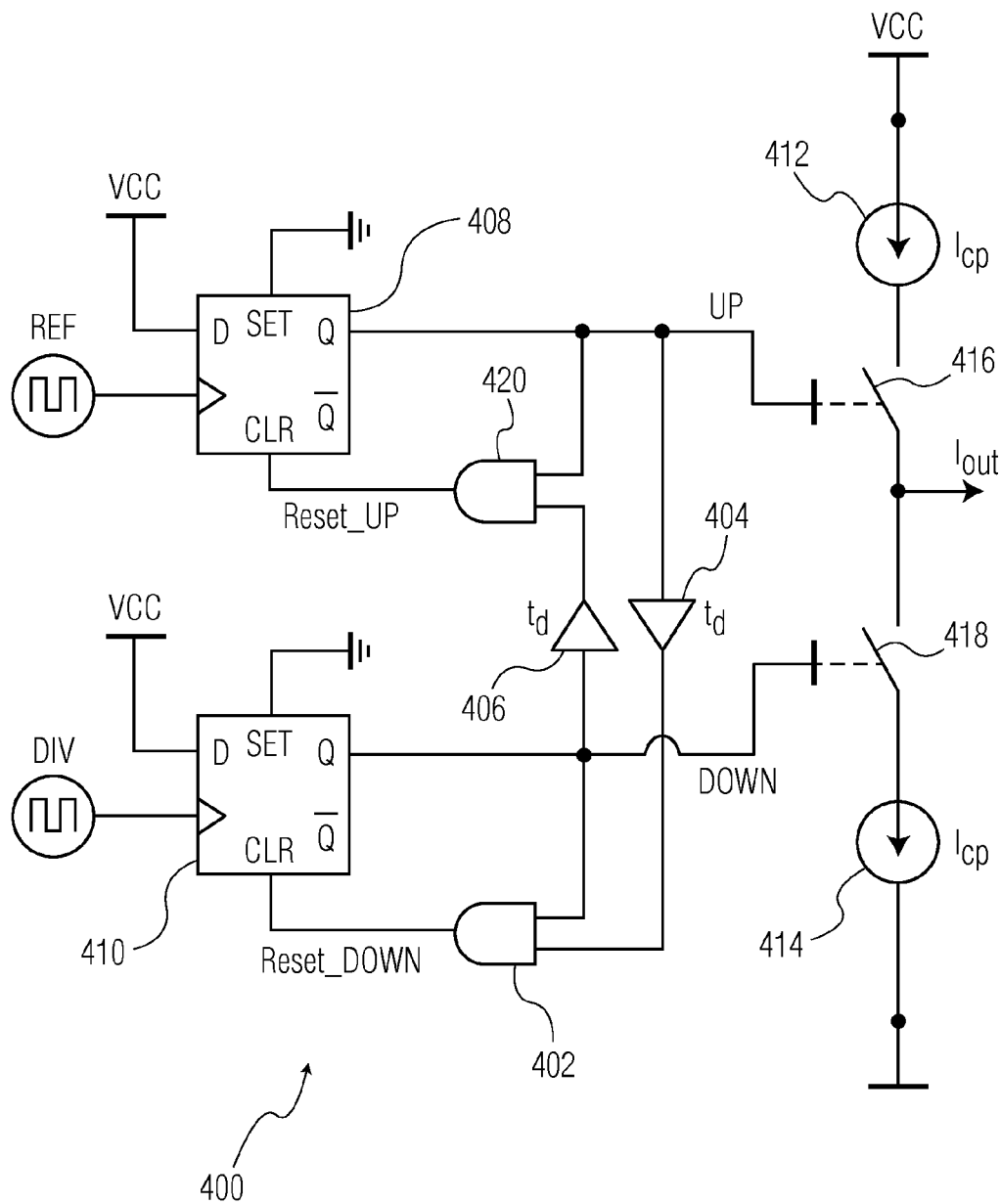
FIG. 4 is a schematic block diagram of a PFD circuit for a PLL according to an embodiment.

FIG. 4 illustrates a PFD circuit 400 for a PLL according to an embodiment. The PFD circuit 400 is similar to the PFD circuit of FIG. 2, but comprises an additional (second) AND logic gate 402 as well as first 404 and second 406 delay elements (which are adapted to delay a signal by a predetermined amount of time $t_d$).

In more detail, the PFD circuit 400 comprises first 408 and second 410 data flip-flops connected to first 412 and second 414 current sources.

A reference frequency signal REF is provided to the clock input terminal of the first data flip-flop 408, and divider frequency signal DIV is provided to the clock input terminal of the second data flip-flop 410. The data D input terminal of each data flip-flop 408,410 is connected to a positive voltage supply rail VCC The first 412 and second 414 current sources are connected in series between the positive voltage supply rail VCC and ground GND. First 416 and second 418 switches are connected in series between the first 412 and second 414 current sources. An output terminal for supplying an output current $I_{OUT}$ of the PFD circuit 400 is connected to point between the first 412 and second 414 switches.

The data Q output of the first data flip flop 408 is connected to the control terminal of the first switch 416, and connected to the first input of a first AND logic gate 420. The data Q output of the first data flip flop 408 is also connected to a second input of the second AND logic gate 402 via the first delay element 404.

Similarly, the data Q output of the second data flip flop 410 is connected to the control terminal of the second switch 418, and connected to the first input of the second AND logic gate 402. The data Q output of the second data flip flop 410 is also connected to a second input of the first AND logic gate 420 via the second delay element 406.

The output of the first AND logic gate 420 is provided to the reset CLR terminal of the first data flip flop 408, and the output of the second AND logic gate 402 is provided to the reset CLR terminal of the second data flip flop 410. In other words, the outputs of the first and second AND logic gates are adapted to be reset signal for the first 408 and second 410 data flip-flops, respectively.

Similarly to the conventional circuit of FIG. 2, the UP and DOWN signals provided by the data Q outputs of the first and second data flip flop, respectively, control current charging/discharging from the first 412 and second 414 current sources, and also control resetting of the flip flops 408,410. However, with each the data Q output of a flip flop being "ANDed" with a delayed version of the data Q output from the other flip flop, resetting is delayed such that operation of the current sources is slightly overlapped. In other words, the operation of the current sources is overlapped so that both current sources are "on" for small phase errors.

Figure 5A:
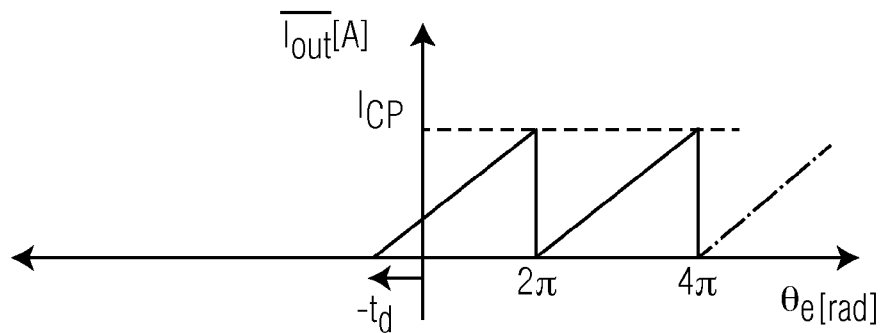
FIGS. 5A and 5B illustrate the relationship between the average output current for positive and negative variations of phase difference at the input of the PFD circuit of FIG. 4, respectively.
Figure 5B:
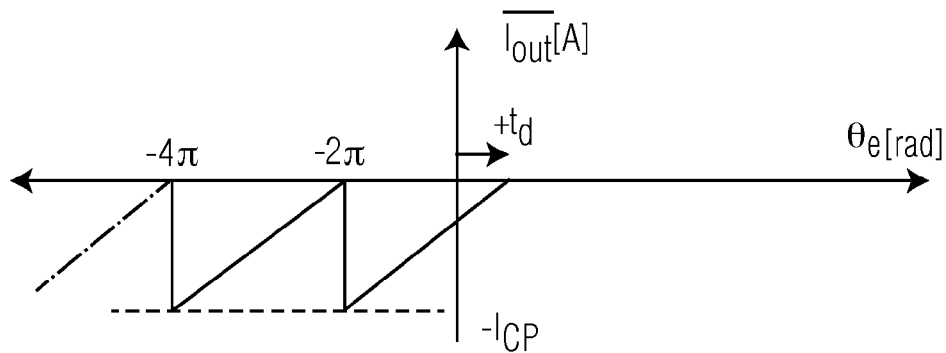

FIGS. 5A and 5B illustrate the relationship between the average output current $\overline{I_{OUT}}$ for positive and negative variations of phase difference at the input of the PFD circuit of FIG. 4, respectively. It will be understood that both current sources are "on" for small phase errors (i.e. errors corresponding to less than the time delay $t_d$).

Figure 5C:
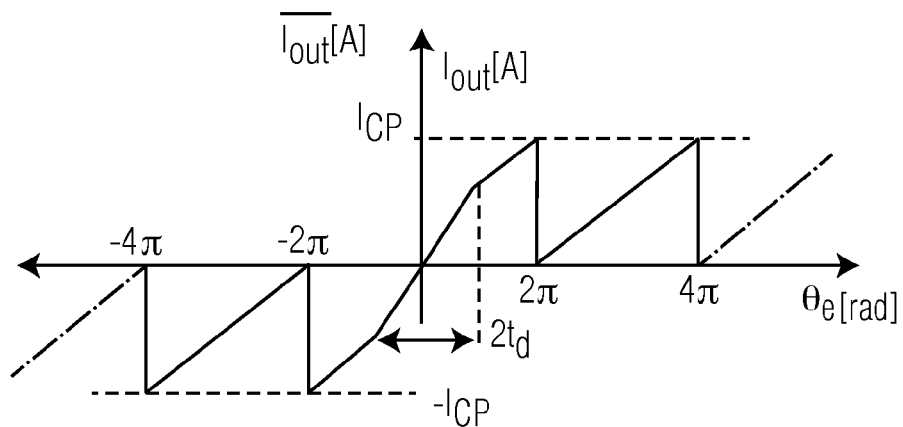
FIG. 5C illustrates the combined relationship between the average output current for variations of phase difference at the input of the PFD circuit of FIG. 4.

FIG. 5C illustrates the combined relationship between the average output current $\overline{I_{OUT}}$ for variations of phase difference at the input of the PFD circuit of FIG. 4. In other words, FIG. 5 illustrates the transfer function of the PFD circuit of FIG. 4.

From FIGS. 5A-5C, it can be seen that the proposed embodiment of FIG. 4 comprises an arrangement where both current sources are "on" for small phase errors. This provides a transfer function that is not linear for phase differences less than $2\pi$ in magnitude but which is instead kinked because of a higher slope (i.e. gain) for (small) phase errors less than $t_d$ in magnitude.

When employed in a PLL, the PFD circuit of FIG. 4 will have a phase error at its input which is maintained within a range by the PLL (assuming the PLL is operating in a lock state). Thus, the phase error at the input of the PFD/CP should be very small and maintained that way by the loop. With the PLL maintaining the phase error in a small window/range, the PFD/CP will operate around the zero crossing (of FIG. 5C) with twice the gain of a conventional PFD/CP circuit. By ensuring the PLL only operates around the zero crossing (with phase errors less than $t_d$, for example, the PLL will not experience the nonlinearity of the transfer function (because it will not provide phase errors greater than $t_d$, for example). As a result, lower system noise will be present (due to higher $K_{pd}$).

The nonlinearity (kinking) of the transfer function illustrated in FIG. 5C is determined by the delay elements (which impart a time delay of $t_d$). These kinks represent the points where the current sources stop operating at the same time.

Also, from FIG. 5C, it can be seen that the transfer function is symmetrical due to the delay elements each providing an identical time delay td.

If non-identical delay elements are employed (as may be done in an alternative embodiment), the position of the kinked points in the transfer will be offset accordingly by the mismatch between the differing delay elements. The effect of such a mismatch may not be seen if the overlapping area is wide enough to ensure operation in the higher gradient (i.e. higher gain) section.

The introduction of a time delay $t_d$ to the data signals used to reset each flip flop also increases the minimum pulse widths of the UP and DOWN outputs from the data flip flops. The benefit of this is that any dead zone is eliminated. A dead zone occurs when the CP does not have enough time to react to short pulses coming from the PFD.

It will be appreciated that a consideration that may need to be taken into account is the calculation of the phase margin. For a fixed loop filter and two values of $K_{pd}$, the phase margin will be slightly better for a lower value of gain. In the case were a phase margin is very low, a loop filter needs to be modified to the new $K_{pd}$ value.

The concept proposed is to bring together the linear curves of FIGS. 5B and 5B so that they overlap for phase errors θe close to zero (i.e. for θe≈0).

FIG. 5A represents the charging current, whereas FIG. 5B represents the discharging current. FIG. 5C is then their sum (i.e the resultant transfer function).

The phase noise contribution of the CP for the conventional arrangement of FIG. 2 can be calculated to be expressed by the following equation (Equation 3):

$$PN_{CP\text{-}old} = 10\log\left(\frac{i_{np}(f)}{K_{pd\text{-}old}}\right)^2 = 20\log\left(\frac{i_{np}(f)}{\frac{I_{CP}}{2\pi}}\right) = 20\log\left(2\pi\frac{i_{np}(f)}{I_{CP}}\right). \quad (3)$$

Undertaking a similar calculation for the embodiment of FIG. 4, the phase noise contribution of the CP (for the embodiment of FIG. 4) can be expressed by the following equation (Equation 4):

$$PN_{CP\text{-}new} = 10\log\left(\frac{i_{np}(f)}{K_{pd\text{-}new}}\right)^2 = 20\log\left(\frac{i_{np}(f)}{\frac{I_{CP}}{\pi}}\right) = 20\log\left(\pi\frac{i_{np}(f)}{I_{CP}}\right). \quad (4)$$

Combining Equations 3 and 4 above, one arrives at the following equation (Equation 5):

$$PN_{CP\text{-}old} = \quad (5)$$
$$20\log\left(2\pi\frac{i_{np}(f)}{I_{CP}}\right) = 20\log\left(\pi\frac{i_{np}(f)}{I_{CP}}\right) + 20\log(2) = PN_{CP\text{-}new} + 6 \text{ dB}$$
$$PN_{CP\text{-}new} = PN_{CP\text{-}old} - 6 \text{ dB}$$

It will therefore be appreciated that the phase noise contribution of the CP for the embodiment of FIG. 4 may be improved by up to 6 dB compared to the phase noise contribution of the CP for the conventional arrangement of FIG. 2.

It is, however, noted that equation 5 above is valid only for input phase errors θe that are inside the overlapping area (i.e. having a magnitude less than that corresponding to the time delay td shown in FIGS. 5A-5C). Outside of that area (i.e. (i.e. for input phase errors θe having a magnitude greater than td shown in FIGS. 5A-5C) the modified PFD acts like the conventional one of FIG. 2.

It is noted that the embodiment of FIG. 4 relies on having the charging and discharging current sources active at the same time (in other words, two noisy currents instead of just one). If that time is too long, more noise may be injected into a PLL. In a worst case scenario, it may potentially lead to more noise coming from the charge pump than the $K_{pd}$ improvement. Accordingly, it will be understood that the approximation made for the CP noise performance to be equal in both cases may only be valid for short delay times. Preferred embodiments may therefore seek to optimize the delay time $t_d$ introduced by the delay elements.

It will be understood that the embodiment shown in FIG. 4 may be implemented using the following components: a conventional tri-state PFD circuit; an additional AND logic gate; and two delay elements. Of course, other embodiments may be implemented using other components and/or circuit topologies.

Figure 6:
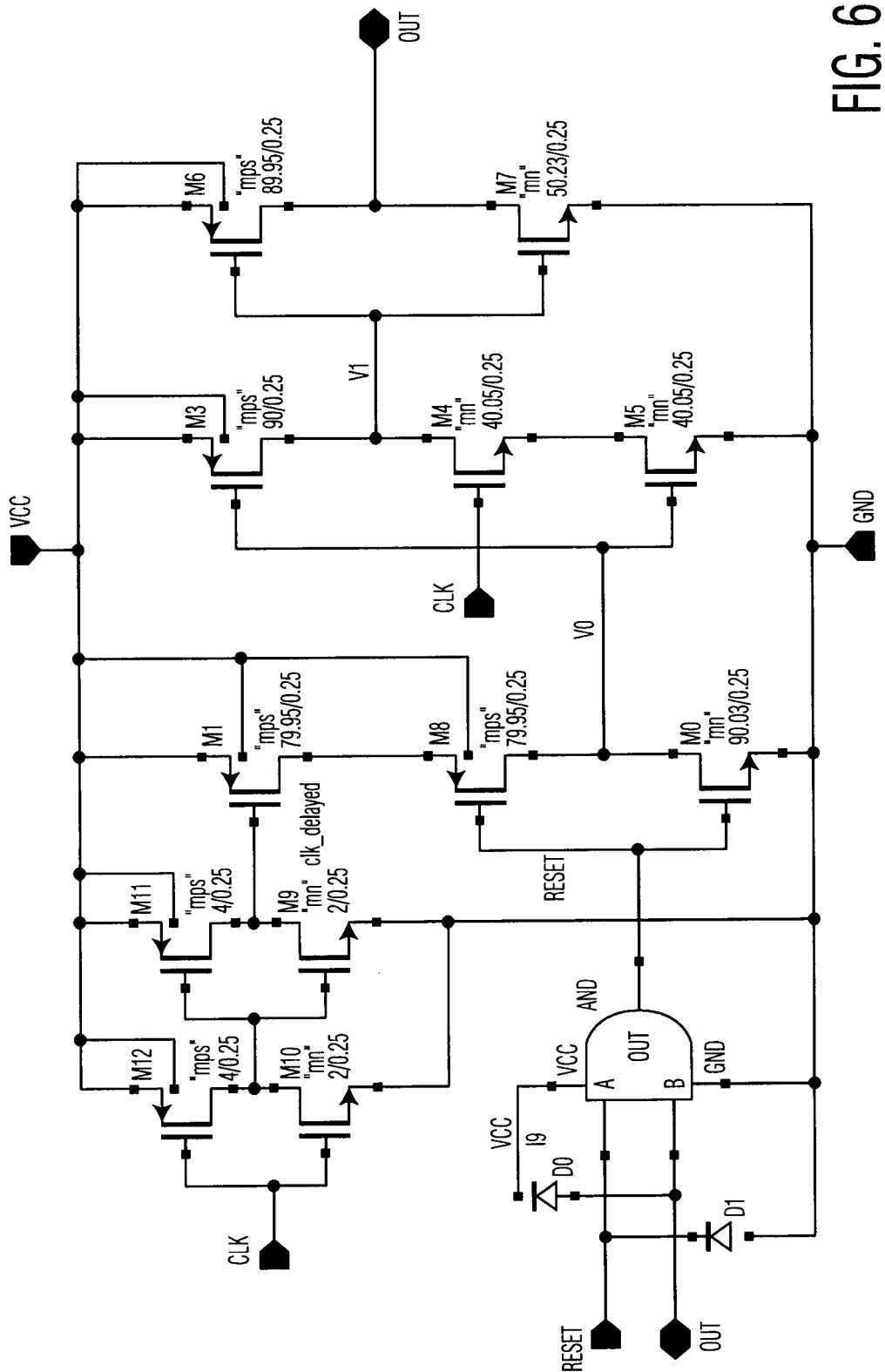
FIG. 6 is a schematic circuit diagram of a rising edge D flip-flop combined with a AND reset logic gate according to an embodiment of the invention.
Figure 7:
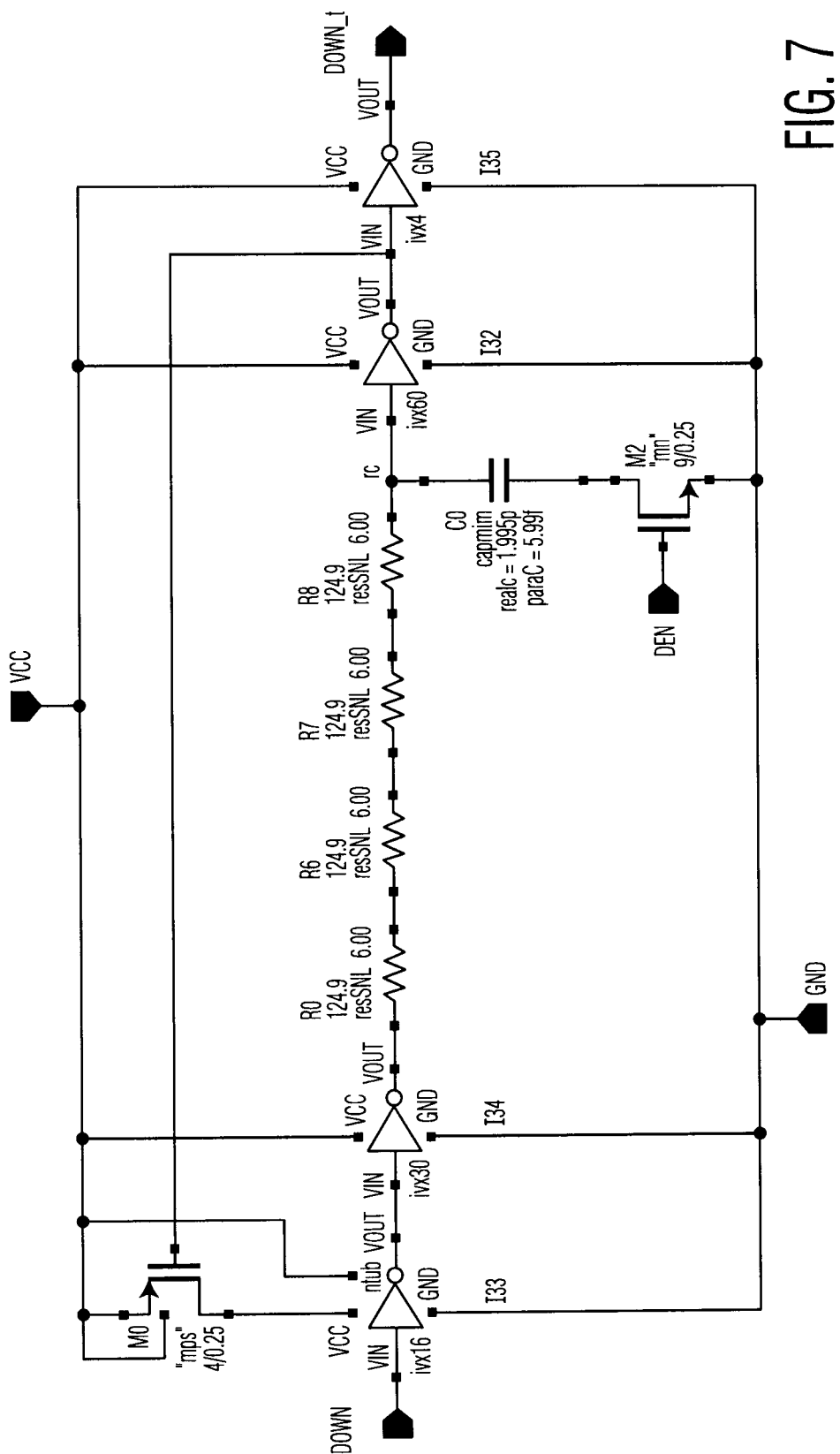
FIG. 7 is a schematic circuit diagram of inverters arranged to create a delay cell according to an embodiment of the invention.

FIGS. 6 and 7 illustrate an exemplary implementation of first and second portions/components of the embodiment of FIG. 4 in 0.25 μm Qubic4X technology.

FIG. 6 is a schematic diagram of a rising edge D flip-flop (e.g. the first D flip flop 408 of FIG. 4) combined with a AND reset logic gate (e.g. the first AND logic gate 420 of FIG. 4). Here, the D flip-flop is implemented in true-single-phase-clock (TSPC) topology to save size area, and the AND reset gate is realised in standard CMOS logic.

FIG. 7 is a schematic diagram of M9-M12 inverters arranged to create a delay cell (e.g. the first delay element 404 of FIG. 4) having a time delay between the transition times of M1 and M4, to avoid any discharge on node V1 when a falling edge happens. The delay is achieved with a RC network. The first two inverters 133 and 134 are used as a buffer for driving the RC load, while the last two are used to speed up the signal so that it has small jitter at its rising edge. Transistor M0 is provided to insure that the delayed signal achieves its asymptotic value even for a short width pulse at the input. The delay cell provides a variable delay of between 1 ns (DEN=$V_{CC}$) and 300 ps (DEN=GND) delay time. The values are of course exemplary because they depend on how the noise of the PFD/CP increases and how the operating point varies due to noise inside the double gain region.

Other possible implementations of a delay cell may employ current starved inverters. However, a drawback associated with such invertors is that they produce small delays in the range of a few tens of picoseconds and may not operate properly for short pulses.

A PFD circuit according to an embodiment may be implemented in integer PLL products used for frequency synthesis such as a TFF1xxxx series device.

Other embodiments may be applicable to optical communications that use NRZ signals where a phase detector is used to regenerate a carrier from the incoming stream of data.

While one or more embodiments have been illustrated in detail, one of ordinary skill in the art will appreciate that modifications and adaptations to those embodiments may be made.

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. A phase-frequency detector (PFD) circuit comprising:
   a PFD portion including first and second D flip-flops configured to generate first and second control signals, respectively, wherein the PFD portion is configured to detect frequency and phase difference of two input signals and to generate the first and second control signals according to the detected frequency and phase difference; and
   a delay and reset portion configured to delay the generated first and second control signals, to generate reset signals for resetting the PFD portion based on a combination of the first and second control signals and the delayed first and second control signals, and to provide the generated reset signals to the PFD portion, wherein the delay and reset portion includes a reset signal generator configured to generate a first reset signal for the first D flip-flop based on the first control signal and the delayed second control signal, and to generate a second reset signal for the second D flip-flop based on the second control signal and the delayed first control signal.

2. The PFD circuit of claim 1, wherein the delay and reset portion further comprises:
   a first delay element configured to delay the first control signal by a first predetermined delay time; and
   a second delay element configured to delay the second control signal by a second predetermined delay time.

3. The PFD circuit of claim 2, wherein the reset signal generator comprises first and second AND logic gates configured to generate the first and second reset signals respectively, wherein the first control signal and the delayed second control signal are provided to the inputs of first AND logic gate, and wherein the second control signal and the delayed first control signal are provided to the inputs of second AND logic gate.

4. The PFD circuit of claim 2, wherein the first and second predetermined delay times are substantially equal to each other.

5. The PFD circuit of claim 2, wherein at least one of the first and second delay elements comprises one or more inverters.

6. The PFD circuit according to claim 1, further comprising a charge pump configured to supply current at an output of the PFD circuit according to the generated control signals.

7. The PFD circuit according to claim 1, wherein the PFD portion comprises a tri-state PFD.

8. A Phase Locked Loop (PLL) circuit comprising the PFD circuit according to claim 1.

9. An optical communications receiver device comprising the PFD circuit according to claim 1.

10. A method of phase-frequency detection for a phase locked loop (PLL) the method comprising:
    operating a PFD circuit portion including a first D flip-flop and a second D flip-flop to detect frequency and phase difference of two input signals and to generate a first control signal and a second control signal according to the detected frequency and phase difference;
    delaying the generated first and second control signals;
    generating reset signals for resetting the PFD circuit portion based on a combination of the first and second control signals and the delayed control signals;
    providing the generated reset signals to the PFD circuit portion; and
    generating a first reset signal for the first D flip-flop based on the first control signal and the delayed second control signal, and to generate a second reset signal for the second D flip-flop based on the second control signal and the delayed first control signal.

11. A computer program product for phase-frequency detection, wherein the computer program product comprises a non-transitory computer-readable storage medium having computer-readable program code embodied therewith, the computer-readable program code configured to perform all of the steps of claim 10.

12. A computer system for phase-frequency detection, the system comprising:
    a memory for storing programming instructions;
    one or more processors configured to perform an operation according to the programming instructions stored in the memory, the operation comprising:
    operating a PFD circuit portion including a first D flip-flop and a second D flip-flop to detect frequency and phase difference of two input signals and to generate a first control signal and a second control signal according to the detected frequency and phase difference;
    delaying the generated first and second control signals;
    generating reset signals for resetting the PFD circuit portion based on a combination of the first and second control signals and the delayed control signals;
    providing the generated reset signals to the PFD circuit portion; and
    generating a first reset signal for the first D flip-flop based on the first control signal and the delayed second control signal, and to generate a second reset signal for the second D flip-flop based on the second control signal and the delayed first control signal.

* * * * *